United States Patent
Raghuraman

(10) Patent No.: US 11,455,221 B2
(45) Date of Patent: Sep. 27, 2022

(54) MEMORY WITH CONCURRENT FAULT DETECTION AND REDUNDANCY

(71) Applicant: QUALCOMM Incorporated, San Diego, CA (US)

(72) Inventor: Praveen Raghuraman, Chennai (IN)

(73) Assignee: QUALCOMM Incorporated, San Diego, CA (US)

( * ) Notice: Subject to any disclaimer, the term of this patent is extended or adjusted under 35 U.S.C. 154(b) by 134 days.

(21) Appl. No.: 17/025,133

(22) Filed: Sep. 18, 2020

(65) Prior Publication Data

US 2021/0133063 A1 May 6, 2021

(30) Foreign Application Priority Data

Oct. 31, 2019 (IN) .............................. 201941044243

(51) Int. Cl.
*G06F 11/07* (2006.01)
*G06F 11/20* (2006.01)
*G11C 29/38* (2006.01)
*H03K 19/02* (2006.01)

(52) U.S. Cl.
CPC .......... *G06F 11/2094* (2013.01); *G11C 29/38* (2013.01); *G06F 2201/85* (2013.01); *H03K 19/02* (2013.01)

(58) Field of Classification Search
CPC ............................ G06F 11/2094; G11C 29/38
USPC ........................................ 714/6.1, 6.11, 6.13
See application file for complete search history.

(56) References Cited

U.S. PATENT DOCUMENTS

| | | | |
|---|---|---|---|
| 6,397,313 B1 * | 5/2002 | Kasa .................... | G11C 29/781 711/108 |
| 9,490,034 B1 * | 11/2016 | Xu ........................ | G11C 29/846 |
| 2001/0046168 A1 | 11/2001 | Barth et al. | |
| 2002/0120887 A1 | 8/2002 | Hughes et al. | |
| 2002/0196683 A1 * | 12/2002 | Ohtani ................... | G11C 29/72 365/200 |
| 2004/0199843 A1 | 10/2004 | Hansquine et al. | |
| 2010/0110808 A1 * | 5/2010 | Riho ....................... | G11C 8/08 365/230.06 |
| 2013/0173970 A1 * | 7/2013 | Kleveland ............ | G11C 29/808 714/710 |
| 2014/0317460 A1 * | 10/2014 | Kleveland ............. | G11C 29/42 714/710 |
| 2017/0084351 A1 | 3/2017 | Querbach et al. | |
| 2022/0036959 A1 * | 2/2022 | Kim ....................... | G11C 29/76 |
| 2022/0069992 A1 * | 3/2022 | Ayyapureddi ........ | H04L 9/0891 |

OTHER PUBLICATIONS

International Search Report and Written Opinion—PCT/US2020/051691—ISA/EPO—dated Nov. 26, 2020.

* cited by examiner

*Primary Examiner* — Chae M Ko
(74) *Attorney, Agent, or Firm* — Qualcomm Incorporated

(57) ABSTRACT

A memory includes an error detection circuit that identifies a faulty feature in an array of memory cells within the memory. A redundancy enable circuit functions to replace the faulty feature with a redundant feature. The error detection circuit and the redundancy enable circuit function concurrently with a read operation on the array of memory cells.

23 Claims, 6 Drawing Sheets activating an error detection circuit to compare a test vector read from an array of memory cells to a recorded test vector to identify a faulty feature in the array of memory cells — 300 during the activation of the error detection circuit, activating a redundancy enable circuit to replace the faulty feature with a redundant feature — 305

MEMORY WITH CONCURRENT FAULT DETECTION AND REDUNDANCY

CROSS REFERENCE TO RELATED APPLICATIONS

The present application claims priority to Indian Provisional Patent Application No. 201941044243, filed Oct. 31, 2019, which is hereby incorporated by reference in its entirety

TECHNICAL FIELD

This application relates to memories, and more particularly to a memory with concurrent fault detection and redundancy.

BACKGROUND

An integrated circuit such as a system on a chip (SoC) typically includes thousands of embedded memories. The embedded memories thus often dominate the die space for the SoC. As the technology continues to shrink the transistor dimensions, the flaws tend to be randomly distributed across the die and will thus affect the embedded memory performance the most since it is the embedded memories that occupy most of the die space. It is thus conventional for embedded memories to include redundant features such as a redundant bit line so that memory faults can be repaired. The repair process is sequential and reduces memory speed. To perform the repair process, the embedded memories are typically checked upon manufacture of the integrated circuit by automated test equipment (ATE) to identify any flaws and activate the corresponding redundant columns to repair the embedded memories. Should an embedded memory become faulty during use, the customer must typically return the integrated circuit to the manufacturer.

SUMMARY

In accordance with a first aspect of the disclosure, a memory is provided that includes: an array of memory cells; an error detection circuit configured to detect an error in the array of memory cells and to identify a faulty feature within the array of memory cells containing the error; a redundancy enable circuit configured to replace the faulty feature with a redundant feature; and a sequencer configured to sequence an output signal from the array of memory cells, an output signal from the error detection circuit, and an output signal from the redundancy enable circuit during a concurrent mode of operation in which the error detection circuit, the redundancy enable circuit, and the array of memory cells are simultaneously active.

In accordance with a second aspect of the disclosure, a method for a memory is provided that includes: activating an error detection circuit to compare a test vector read from an array of memory cells to a recorded test vector to identify a faulty feature in the array of memory cells; and during the activation of the error detection circuit, activating a redundancy enable circuit to replace the faulty feature with a redundant feature.

In accordance with a third aspect of the disclosure, a memory is provided that includes: a memory array configured to retrieve a test vector during a concurrent mode of operation, and a redundancy enable circuit configured to replace a faulty feature with a replacement feature during the concurrent mode of operation.

These and other advantageous features may be better appreciated through the following detailed description.

BRIEF DESCRIPTION OF DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1A:
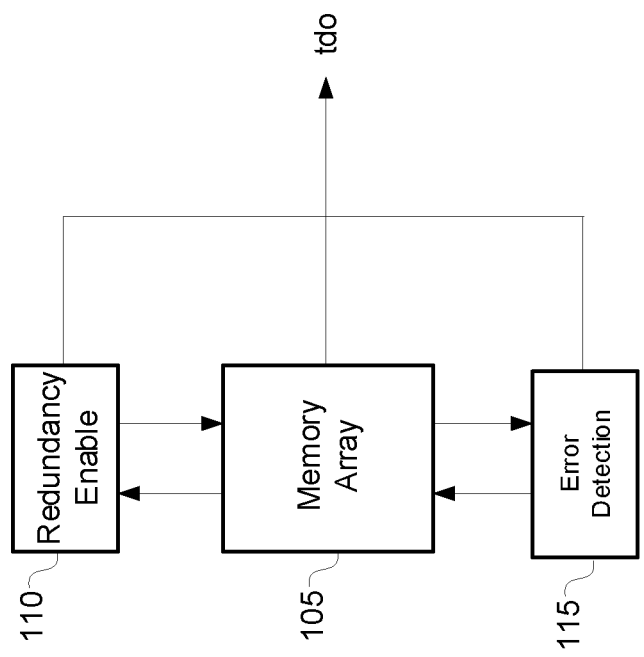
FIG. 1A illustrates a conventional memory array and an associated error detection circuit and a redundancy enable circuit.

A concurrent memory is provided in which the error detection and repair operations may occur concurrently with read and write operations. The resulting concurrent operation is quite advantageous for reducing the time for detecting and repairing memory faults. In contrast, it is conventional for functional read and write operations as well as diagnostic and repair operations for the memory to be performed sequentially. This may be better appreciated with reference to FIG. IA, which shows a conventional memory array 105. During normal operation, an output data stream (tdo) may be read from memory array 105. But the operation of memory array 105 may be affected by manufacturing errors. An error detection circuit 115 functions to detect these errors by recording a test vector that is written into memory array 105. During a subsequent read operation, the error detection circuit 115 compares a retrieved output vector from memory array 105 to the recorded test vector to identify any erroneous bitcells in memory array 105.

Should the error detection circuit 115 detect an error, a redundancy enable circuit 110 functions to replace the erroneous bitcells in memory array 105 with redundant replacement bitcells. For example, it is conventional for the bitcells in memory array 105 to be arranged into rows and columns. To provide redundant features, memory array 105 may also include one or more redundant columns or rows of replacement bitcells. Should the memory array 105 have a column of bitcells that is not functioning correctly due to a manufacturing error as detected by the error detection circuit 115, the erroneous column may be replaced by a redundant column by the redundancy enable circuit 110. Alternatively, the redundancy enable circuit 110 may replace an erroneous row of bitcells with a redundant row.

Error detection circuit 115 provides a report of any errors found by messaging an output signal through the output data stream. Similarly, the redundancy enable circuit 110 reports a confirmation of a replacement of the erroneous column (or row) by messaging an output signal through the output data stream. Given this common usage of the output data stream, it is conventional that an external tool (e.g., an ATE) sequentially controls the operation of the diagnostics by the error detection circuit 115 and the repair by the redundancy enable circuit 110. An error detection requires the writing and reading of a test vector to the memory array 105. The read of the test vector from memory array 105 drives the retrieved test vector out over the output data stream. Since this read operation is using the output data stream, it occurs before activation of the error detection circuit 115 to prevent contention in the output data stream. The conventional writing and reading of the test vector prior to the operation of the error detection circuit 115 is denoted herein as a functional mode of operation. The functional mode of operation thus occurs before a diagnostic mode of operation by error detection circuit 115. Similarly, the diagnostic mode of operation occurs before a repair mode of operation by redundancy enable circuit 110.

Figure 1B:
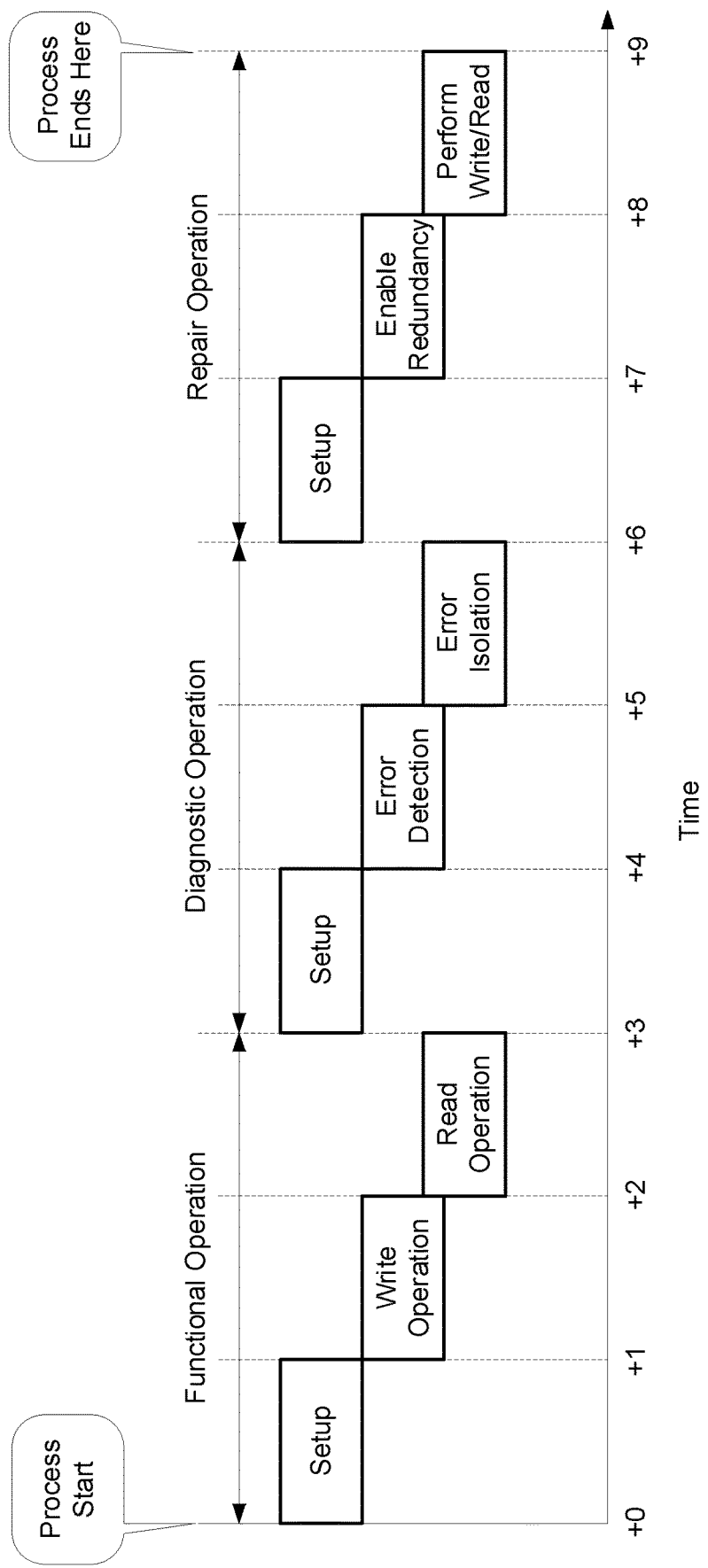
FIG. 1B illustrates a conventional memory time line for the sequential diagnosis and repair of the memory array of FIG. 1A.

A time line for this sequential operation is shown in FIG. 1B. The functional mode of operation begins at time t0 with a setup operation. At a time t1, a write operation occurs in which a test vector is written to the memory array 105. The error detection circuit 115 also records the test vector during this write operation. For example, the error detection circuit 115 contains a sufficient number of memory elements (e.g., latches) to store the test vector being written into memory array 105. The write operation is followed by a read operation at a time t2 in which the test vector is read (retrieved) from the memory array 105.

At a time t3, a diagnostic mode of operation begins with a setup at time t3. At a time t4, an error detection operation by error detection circuit 115 occurs until a time t5. Such an error detection operation involves comparing the recorded test vector that was recorded by error detection circuit 115 during the write operation to the retrieved test vector read from the memory array 105 during the read operation. If the read operation test vector differs from the recorded test vector, an error is detected by error detection circuit 115. The diagnostic operation also includes an error isolation operation that begins at time t5 and ends at a time t6. Through the error isolation operation, the error detection circuit 115 identifies the faulty feature in the memory array 105 (e.g., a faulty column) that produced the detected error. Error detection circuit 115 transmits the identity of the faulty feature through the output data stream to the external test tool.

A repair mode of operation begins at time t6 with a setup operation that ends at time t7. A redundancy enable operation begins at time t7 and continues to a time t8. During the redundancy enable operation, the redundancy enable circuit 110 enables a redundant feature such as a redundant column to replace the faulty feature identified in the preceding error isolation operation. The repair mode of operation ends with a write/read operation being performed from time t8 to a time t9 that may be used to confirm successful operation of the enabled redundant feature.

Figure 2A:
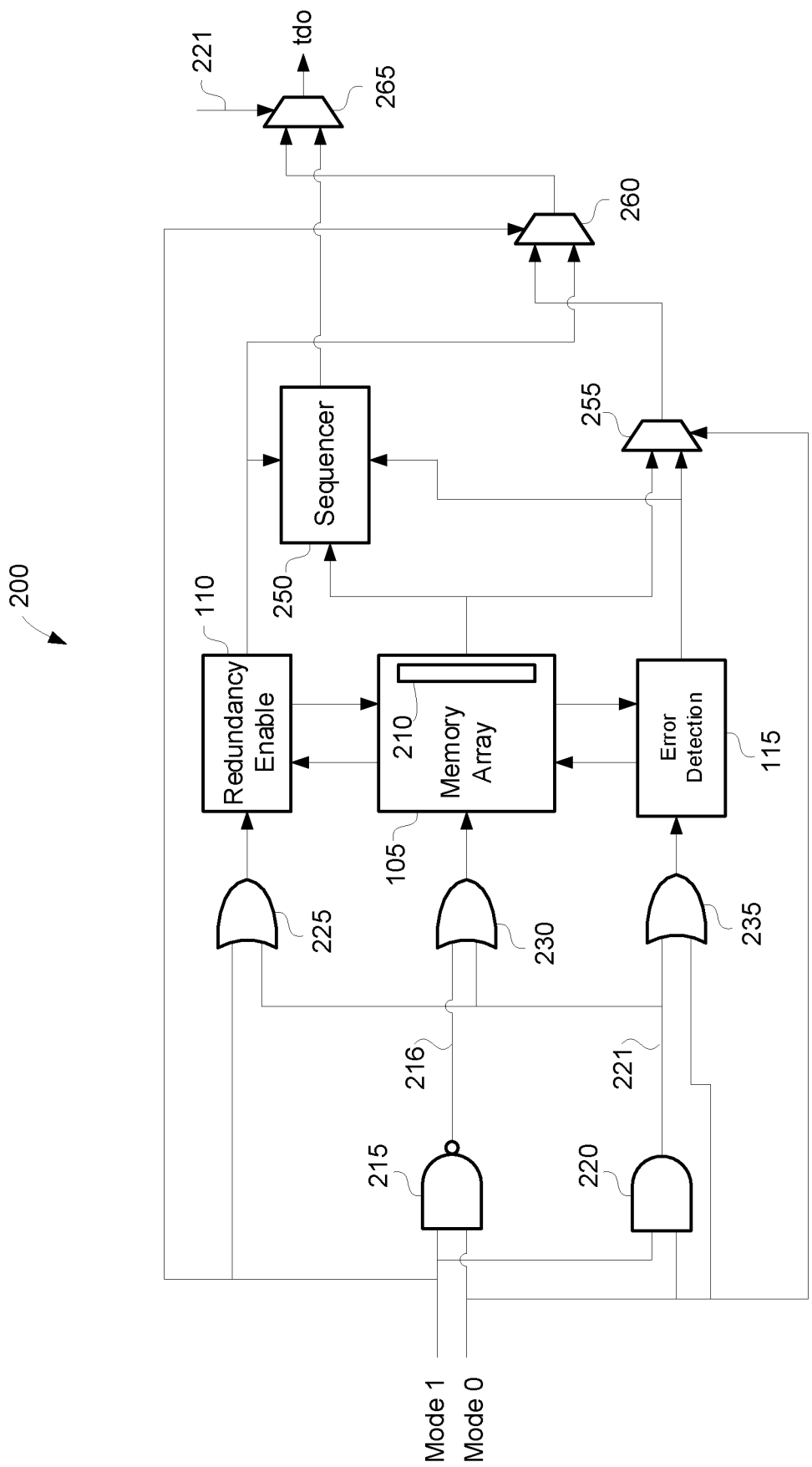
FIG. 2A illustrates an example concurrent memory in which the diagnosis and repair occur concurrently in accordance with an aspect of the disclosure.

To greatly reduce the time needed to complete the diagnostic and repair modes of operation, a concurrent memory is disclosed in which the error detection, error isolation, and redundancy enable operations are performed concurrently with reading of the error vector. Advantageously, this concurrent memory needs no modifications to the redundancy enable circuit 110. Similarly, no modifications are necessary to the error detection circuit 115. Since these circuits are known, their construction will not be discussed in detail herein. But what is not conventional is the logic in the concurrent memory along with a sequencer that enables the concurrent memory operation. An example memory 200 with a concurrent mode of operation is shown in FIG. 2A. Memory 200 responds to two mode signals: a mode 1 signal and a mode 0 signal. Should both the mode signals be asserted, a concurrent mode of operation is activated as will be discussed further herein. But memory 200 is also backwards compatible with the sequential functional mode of operation, diagnostic mode of operation, and the repair mode of operation as discussed with regard to memory array 105 depending upon the state of the mode signals. The resulting mode control by the mode signals is summarized in the following table:

| Mode 1 | Mode 0 | Operational Mode |
| --- | --- | --- |
| 0 | 0 | Functional |
| 0 | 1 | Diagnostic |
| 1 | 0 | Repair |
| 1 | 1 | Concurrent |

Memory 200 includes an array 105 of bitcells or memory cells, an error detection circuit 115, and a redundancy enable circuit 110 as discussed with regard to FIG. 1A. During the functional mode in which both the mode signals are logical zeroes, a NAND gate 215 that receives both the mode signals asserts a memory enable signal 216. The asserted memory enable signal 216 passes through an OR gate 230 to activate memory array 105 for the functional mode operation. For example, memory array 105 may be powered down or in a low-power mode prior to the activation by memory enable signal 216. In response to the assertion of memory enable signal 216, memory array 105 is fully powered. As defined herein, a signal is deemed to be asserted when the signal is logically true, regardless of whether the logical true state is represented by an active-high or an active-low convention. In an active-high convention, a signal is asserted by being charged to a power supply voltage. In an active-low convention, a signal is asserted by being discharged to ground. During the functional mode, both a write operation to memory array 105 and a subsequent read operation from memory array 105 occur as discussed with regard to FIG. 1A. The binary zero value for the mode 0 signal controls a multiplexer 255 to select for the retrieved test vector(s) from memory array 105. Similarly, the binary zero for the mode 1 signal controls a multiplexer 260 to select for the output signal from multiplexer 255.

In the functional mode, a concurrent mode enable signal 221 from an AND gate 220 that processes both of the mode signals will be de-asserted. The de-asserted concurrent mode enable signal 221 from NAND gate 215 controls a multiplexer 265 to select for the output signal from multiplexer 260. During the functional mode, the retrieved test vector(s) from memory array 105 will thus flow through multiplexers 255, 260, and 265 to form an output data stream (tdo) to whatever system is controlling memory 200. This controlling system may be integrated into an integrated circuit with memory 200.

The concurrent mode enable signal 221 drives an OR gate 235 and an OR gate 225 as well as OR gate 230. OR gate 235 also receives the mode 0 signal. An output signal from OR gate 235 controls whether the error detection circuit 115 is activated. Since concurrent mode enable signal 221 and the mode 0 signal to OR gate 235 are both de-asserted during the functional mode, the error detection circuit 115 is not activated. Similarly, the mode 1 signal and concurrent mode enable signal 221 are received by OR gate 225. An output signal from OR gate 225 controls whether the redundancy enable circuit 110 is activated. Since the output signal from OR gate 225 is de-asserted during the functional mode due to the de-assertion of both the mode 1 signal and concurrent mode enable signal 221, the redundancy enable circuit 110 is not activated during the functional mode.

Although the error detection circuit 110 is not activated during the functional mode of operation, its status changes in the diagnostic mode of operation. During the diagnostic mode of operation, the mode 0 signal has a logical 1 value. The asserted mode 0 signal propagates through OR gate 235 to activate the error detection circuit 115. During the functional mode of operation, the error detection circuit 115 recorded the test vector(s) that was written into memory array 105. When activated in the diagnostic mode of operation, error detection circuit 115 is configured to compare its recorded test vector(s) to the corresponding retrieved test vector(s) read from memory array 105 to detect any errors. Similarly, the error detection circuit 115 is further configured during the diagnostic mode of operation to identify the feature in memory array 105 that caused the error (for example, a faulty column). The assertion of the mode 0 signal causes multiplexer 255 to select for an output signal from the error detection circuit 115. Multiplexers 260 and 265 continue to operate as discussed for the functional mode of operation during the diagnostic mode of operation since the mode 1 signal has a logical zero value in both modes of operation. Error detection circuit 115 may thus communicate the identity of the faulty feature to an external controller (not illustrated) through multiplexers 255, 260, and 265. Since both the concurrent mode enable signal 221 and the mode 1 signal are de-asserted during the diagnostic mode of operation, the output signal of OR gate 225 will be de-asserted so that the redundancy enable circuit 110 is not activated during the diagnostic mode of operation. Memory enable signal 216 is asserted during the diagnostic mode of operation so that memory array 105 can be active.

The repair mode of operation is active when the mode 1 signal is a logical one while the mode 0 signal is a logical zero. The asserted value for the mode 1 signal propagates through OR gate 225 to activate the redundancy enable circuit 110. Similarly, the memory enable signal 216 is asserted during the repair mode of operation so that the memory array 105 is active. The activation of the redundancy enable circuit 110 during the repair mode of operation causes the redundancy enable circuit 110 to replace the faulty feature identified during the diagnostic mode of operation (if any). For example, the redundancy enable circuit 110 may replace a faulty column (not illustrated) with a redundant column 210. In alternative embodiments, a faulty row may be replaced by a redundant row (not illustrated). The redundancy enable circuit 110 communicates a confirmation of the activation of the redundant feature by transmitting an output signal to the external controller. To do so, the assertion of the mode 1 signal controls multiplexer 260 to select for the output signal from the redundancy enable circuit 110. In turn, the de-asserted concurrent mode enable signal 221 controls multiplexer 265 to select for the output signal of the redundancy enable circuit 110 as routed through multiplexer 260 to drive the output data stream accordingly. AND gate 220 de-asserts the concurrent mode enable signal 221 during the repair mode of operation. Since both the concurrent mode enable signal 221 and the mode 0 signal are de-asserted during the repair mode of operation, the output signal from OR gate 235 will be de-asserted to keep the error detection circuit 115 from functioning during the repair mode of operation.

Figure 2B:
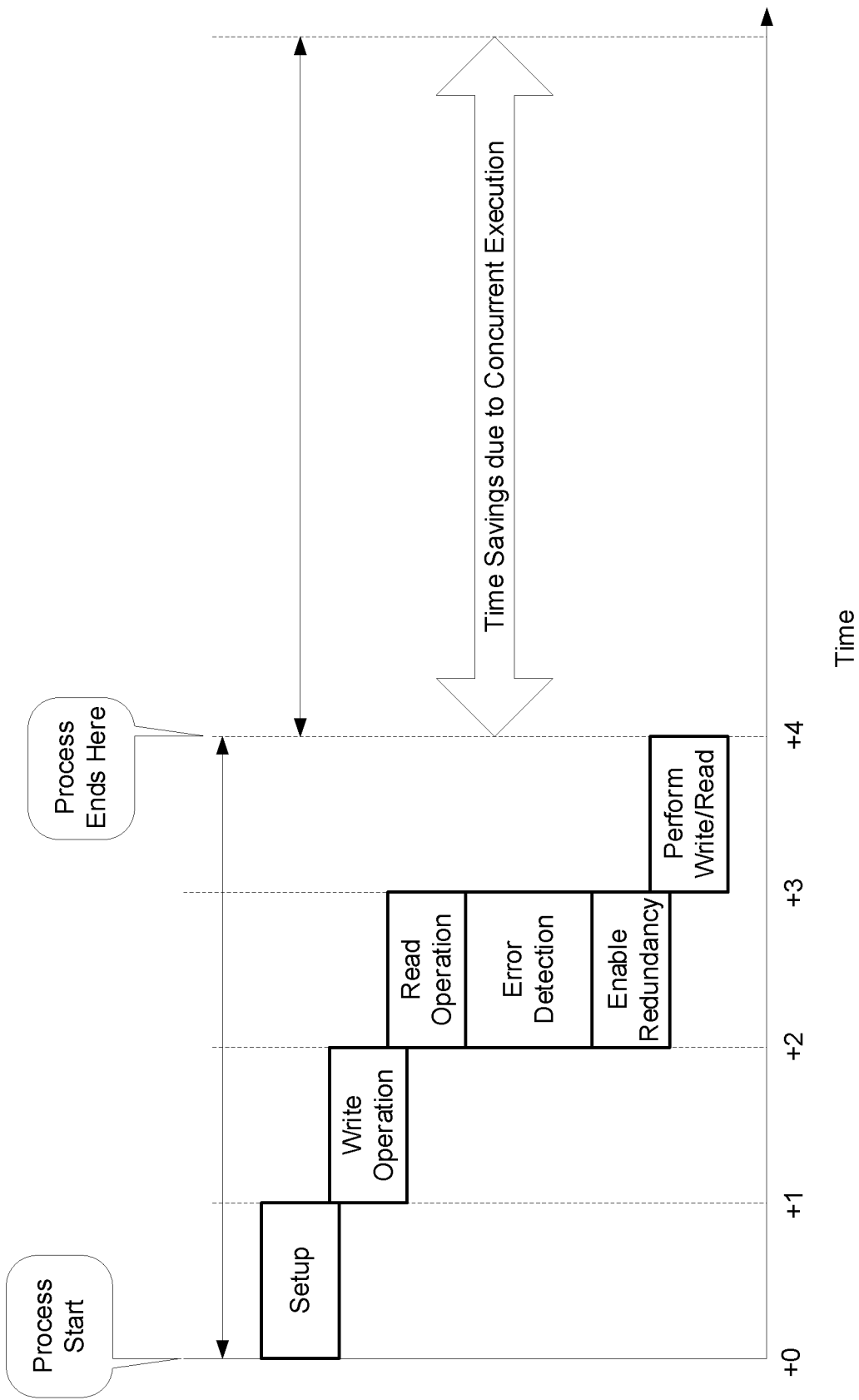
FIG. 2B illustrates a concurrent memory time line in which the diagnostic and repair operations occur concurrently with a read operation in the concurrent memory of FIG. 2A in accordance with an aspect of the disclosure.

In the concurrent mode of operation, both the mode 1 signal and the mode 0 signal are asserted to a logical one value. AND gate 220 thus asserts the concurrent mode enable signal 221 during the concurrent mode of operation. The asserted concurrent mode enable signal 221 is received by OR gates 225, 230, and 235. The output signal from each of OR gates 225, 230, and 235 may each be denoted as an activation signal. For example, the activation signal from OR gate 225 activates the operation of the redundancy enable circuit 110. Similarly, the activation signal from OR gate 230 activates the operation of memory array 105. Finally, the activation signal from OR gate 235 activates the operation of the error detection circuit 115. Thus, redundancy enable circuit 110, memory array 105, and error detection circuit 115 will all be concurrently activated in the concurrent mode of operation. A time line for an example concurrent mode of operation is shown in FIG. 2B. A write operation begins at a time t1 and ends at a time t2. During this write operation, a test vector (or test vectors) is written to the memory array 105. The error detection circuit 115 also record the test vector during this write operation. A read operation begins at time t2 and ends at a time t3 to read the test vector(s) from the memory array 105. Concurrent with the read operation is an error detection operation during which the error detection circuit 115 compares the recorded test vector(s) to the retrieved test vector(s) read from memory array 105. Should the comparison indicate a difference, the error or fault in the memory that produced this difference is isolated in an error isolation operation by the error detection circuit 115 that also occurs concurrently with the read operation. Finally, the redundancy enable circuit 110 replaces the faulty feature with a redundant feature in a redundancy enable operation that is also concurrent with the read operation from time t2 to time t3. From a time t3 to a time t4, a final read/write operation is performed to confirm the success of the repair. The concurrent operation thus advantageously is finished at time t4 whereas the conventional sequential operation discussed for FIG. 1B extends to a time t9. In that regard, it will be appreciated that the time scales for FIGS. 1B and 2B are substantially the same.

During the concurrent mode of operation, the test vector read from memory array 105 during the read operation will pass through the output data stream. But this read operation is concurrent with an error detection and identification of the faulty feature in memory array 105 as performed by error detection circuit 115 that also uses the output data stream. Similarly, the read operation is concurrent with the repair mode of operation in which the redundancy enable circuit 110 confirms that the faulty feature has been replaced using the output data stream. To prevent collision between the output signal from memory array 105 and the output signals from error detection circuit 115 and the redundancy enable circuit 110, all these output signals are received by a sequencer 250 that sequences them during the concurrent mode of operation to prevent collision in the output data stream. A resulting output signal from sequencer 250 is selected for by multiplexer 265 in response to the assertion of concurrent mode enable signal 221.

Figure 3:
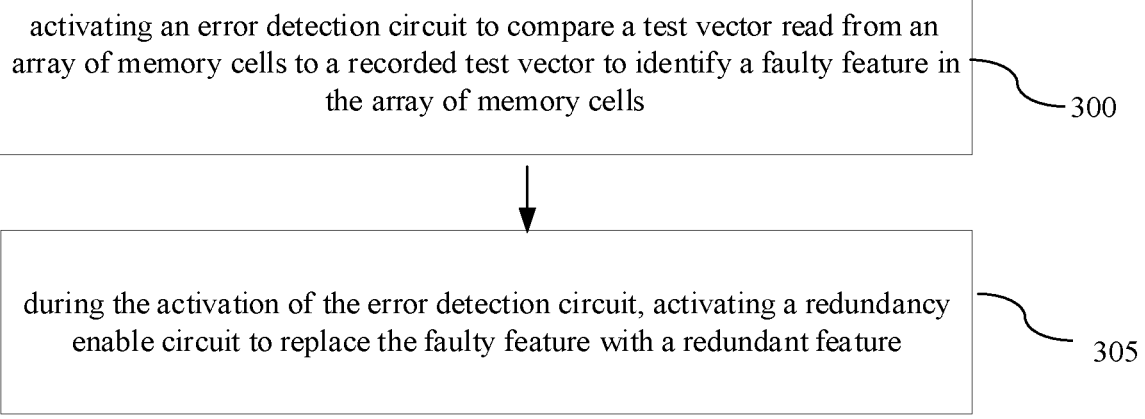
FIG. 3 is a flowchart for an example concurrent mode of operation in accordance with an aspect of the disclosure.

A flowchart for an example concurrent mode of operation is shown in FIG. 3. The method includes an act 300 of activating an error detection circuit to compare a test vector read from an array of memory cells to a recorded test vector to identify a faulty feature in the array of memory cells. The activation of the error detection circuit 110 in concurrent memory 200 by concurrent mode enable signal 221 is an example of act 300. In addition, the method includes an act 305 that occurs during the activation of the error detection circuit and includes activating a redundancy enable circuit to replace the faulty feature with a redundant feature. The activation of the redundancy enable circuit 110 in concurrent memory 200 by concurrent mode enable signal 221 is an example of act 305.

Figure 4:
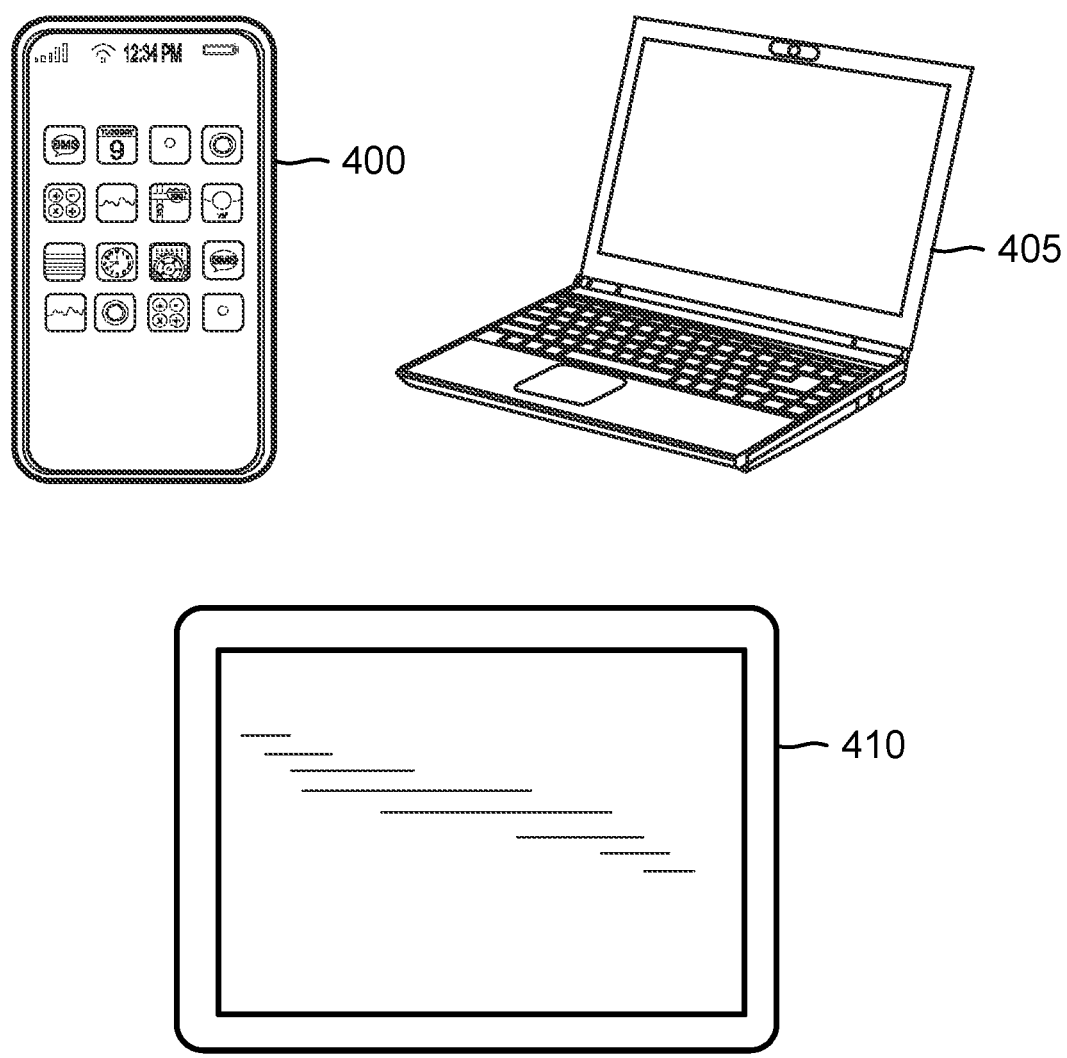
FIG. 4. illustrates some example electronic systems each incorporating a memory having a concurrent mode of operation in accordance with an aspect of the disclosure.

A memory with the advantageous concurrent mode of operation disclosed herein may be incorporated into a wide variety of electronic systems. For example, as shown in FIG. 4, a cellular telephone 400, a laptop 405, and a tablet PC 410 may all include a concurrent mode memory in accordance with the disclosure. Other exemplary electronic systems such as a music player, a video player, a communication device, and a personal computer may also be configured with memories constructed in accordance with the disclosure.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A memory, comprising:
an array of memory cells;
an error detection circuit configured to detect an error in the array of memory cells and to identify a faulty feature within the array of memory cells containing the error, wherein the error detection circuit is configured to be active responsive to an assertion of a first mode signal and to be inactive responsive to a de-assertion of the first mode signal;
a redundancy enable circuit configured to replace the faulty feature with a redundant feature, wherein the redundancy enable circuit is configured to be active responsive to an assertion of a second mode signal and to be inactive responsive to a de-assertion of the second mode signal; and
a first logic gate configured to process the first mode signal and the second mode signal to produce a concurrent mode signal, wherein the array of memory cells, the redundancy enable circuit, and the error detection circuit are each further configured to be simultaneously active responsive to an assertion of the concurrent mode signal.

2. The memory of claim 1, wherein an output signal from the array of memory cells is a retrieved test vector for error detection, and wherein the error detection circuit is further configured to compare the retrieved test vector to a recorded test vector to detect the error.

3. The memory of claim 1, wherein an output signal from the error detection circuit comprises an identification of the faulty feature.

4. The memory of claim 1, wherein an output signal from the redundancy enable circuit comprises a confirmation of a replacement of the faulty feature with the redundant feature.

5. The memory of claim 1, wherein the redundant feature comprises a redundant column for the array of memory cells.

6. The memory of claim 1, further comprising:
a sequencer configured to sequence an output signal from the array of memory cells, an output signal from the error detection circuit, and an output signal from the redundancy enable circuit during a concurrent mode of operation in which the concurrent mode signal is asserted.

7. The memory of claim 1 6, wherein the first logic gate is an AND gate.

8. The memory of claim 6, further comprising a second logic gate configured to process the first mode signal and the second mode signal to produce a memory enable signal, wherein the array of memory cells is configured to be active in response to an assertion of the memory enable signal.

9. The memory of claim 8, wherein the second logic gate is a NAND gate.

10. The memory of claim 8, further comprising:
a first multiplexer configured to select between the output signal from the array of memory cells and the output signal from the error detection circuit responsive to the first mode signal.

11. The memory of claim 10, further comprising:
a second multiplexer configured to select between the output signal from the redundancy enable circuit and an output signal from the first multiplexer responsive to the second mode signal.

12. The memory of claim 11, further comprising:
a third multiplexer configured to select between an output signal from the second multiplexer and an output signal from the sequencer responsive to the concurrent mode signal.

13. The memory of claim 8, further comprising:
a third logic gate configured to process the concurrent mode signal with the second mode signal to provide an activation signal to the redundancy enable circuit.

14. The memory of claim 13, further comprising:
a fourth logic gate configured to process the memory enable signal with the concurrent mode signal to provide an activation signal to the array of memory cells.

15. The memory of claim 14, further comprising:
a fifth logic gate configured to process the concurrent mode signal with the first mode signal to provide an activation signal to the error detection circuit.

16. The memory claim 15, wherein the third logic gate, the fourth logic gate, and the fifth logic gate each comprises an OR gate.

17. A method for a concurrent mode of operation for a memory, comprising:
asserting a concurrent mode signal responsive to a simultaneous assertion of a first mode signal and a second mode signal to begin a concurrent mode of operation;
during the concurrent mode of operation, activating an error detection circuit to compare a test vector read from an array of memory cells to a recorded test vector to identify a faulty feature in the array of memory cells and simultaneously activating a redundancy enable circuit to replace the faulty feature with a redundant feature;
asserting the first mode signal while de-asserting the second mode signal to begin a diagnostic mode of operation; and
activating the error detection circuit while the redundancy enable circuit is inactive during the diagnostic mode of operation.

18. The method of claim 17, further comprising:
asserting the second mode signal while de-asserting the first mode signal to begin a repair mode of operation; and
activating the redundancy enable circuit while the error detection circuit is inactive during the repair mode of operation.

19. The method of claim 17, further comprising:
during the activating of the error detection circuit and of the redundancy enable circuit, sequencing a first output signal from the array of memory cells, a second output signal identifying the faulty feature, and a third output signal confirming a replacement of the faulty feature with the redundant feature.

20. A concurrent memory, comprising:
a memory array;
an error detection circuit configured to identify a faulty feature responsive to an assertion of a first mode signal; and
a redundancy enable circuit configured to replace the faulty feature with a replacement feature responsive to an assertion of a second mode signal.

21. The concurrent memory of claim 20, wherein the faulty feature is a column of bitcells in the memory array.

22. The concurrent memory of claim 20, further comprising:
a sequencer configured to sequence an output signal from the memory array, an output signal from the error detection circuit, and an output signal from the redundancy enable circuit.

23. The concurrent memory of claim 20, wherein the concurrent memory is included within a cellular telephone.

* * * * *